United States Patent
Xie et al.

(10) Patent No.: US 10,303,402 B2
(45) Date of Patent: May 28, 2019

(54) DATA COMPRESSION USING PARTIAL STATISTICS

(71) Applicant: Seagate Technology LLC, Cupertino, CA (US)

(72) Inventors: Hongmei Xie, Milpitas, CA (US); Zhengang Chen, San Jose, CA (US); Bijan Eskandari-Gharnin, Longmont, CO (US); Erich F. Haratsch, Fremont, CA (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 330 days.

(21) Appl. No.: 15/226,182

(22) Filed: Aug. 2, 2016

(65) Prior Publication Data

US 2018/0039426 A1 Feb. 8, 2018

(51) Int. Cl.
*H03M 7/30* (2006.01)
*G06F 3/06* (2006.01)

(52) U.S. Cl.
CPC .......... *G06F 3/0673* (2013.01); *G06F 3/0608* (2013.01); *G06F 3/0616* (2013.01); *G06F 3/0638* (2013.01); *G06F 3/0656* (2013.01); *G06F 3/0658* (2013.01); *G06F 3/0674* (2013.01); *H03M 7/30* (2013.01); *H03M 7/3079* (2013.01); *H03M 7/607* (2013.01); *H03M 7/6088* (2013.01); *G06F 2212/1016* (2013.01); *G06F 2212/1036* (2013.01); *G06F 2212/401* (2013.01)

(58) Field of Classification Search
None
See application file for complete search history.

(56) References Cited

U.S. PATENT DOCUMENTS

| 5,951,623 | A  | 9/1999  | Reynar et al. |
|-----------|----|---------|---------------|
| 7,386,046 | B2 | 6/2008  | Fallon et al. |
| 8,432,967 | B2 | 4/2013  | Hosaka et al. |
| 8,610,604 | B2 | 12/2013 | Glass et al.  |

(Continued)

OTHER PUBLICATIONS

Ziv, Jacob et al., "A Universal Algorithm for Sequential Data Compression", IEEE Transactions on Information Theory, vol. IT-23, No. 3, May 1977, 7 pages total.

(Continued)

*Primary Examiner* — Aimee Li
*Assistant Examiner* — Edmund H Kwong
(74) *Attorney, Agent, or Firm* — Westman, Champlin & Koehler, P.A.

(57) ABSTRACT

A data storage device includes at least one data storage medium and a controller that is operably coupled to the at least one data storage medium. The controller receives the bit stream in a data storage device and performs a first level of compression on the received bit stream to obtain a symbol frame including a plurality of symbols. The controller encodes an initial portion of the plurality of symbols contained in the symbol frame by a fixed encoding scheme. The controller also collects statistics for the initial portion of the symbol frame. The controller then selects at least one data compression algorithm based on the collected statistics. The controller then performs compression encoding on a remaining portion of the symbol frame with the selected at least one data compression algorithm.

20 Claims, 6 Drawing Sheets

(56) References Cited

U.S. PATENT DOCUMENTS

| | | | |
|---|---|---|---|
| 8,791,843 B2* | 7/2014 | Cohen | H03M 7/3079 |
| | | | 341/51 |
| 8,904,044 B2 | 12/2014 | Ebling et al. | |
| 8,912,932 B2 | 12/2014 | Chen et al. | |
| 9,054,728 B2 | 6/2015 | Fallon | |
| 9,054,729 B2 | 6/2015 | Carlson | |
| 9,059,729 B1 | 6/2015 | Wu et al. | |
| 9,116,902 B1 | 8/2015 | Shilane et al. | |
| 9,160,362 B1 | 10/2015 | Ansari et al. | |
| 9,225,355 B2 | 12/2015 | Harnik et al. | |
| 9,231,615 B2 | 1/2016 | Chen | |
| 9,251,159 B1 | 2/2016 | Armangau et al. | |
| 9,253,421 B2 | 2/2016 | Campbell et al. | |
| 9,286,313 B1 | 3/2016 | Sharangpani | |
| 9,344,113 B1 | 5/2016 | Langhammer | |
| 9,344,114 B1 | 5/2016 | Milner et al. | |
| 9,385,749 B1* | 7/2016 | Nam | H03M 7/6082 |
| 9,843,802 B1* | 12/2017 | Wallace | H04N 19/10 |
| 2008/0181522 A1 | 7/2008 | Hosaka et al. | |
| 2009/0045991 A1* | 2/2009 | Schneider | H03M 7/3086 |
| | | | 341/60 |
| 2016/0127513 A1 | 5/2016 | Fallon et al. | |

OTHER PUBLICATIONS

PDF version of https://en.wikipedia.org/wiki/Write_amplification, page last modified on Jul. 23, 2016 at 9:31, printed and made into PDF version on Aug. 1, 2016, 8 page.

* cited by examiner

DATA COMPRESSION USING PARTIAL STATISTICS

BACKGROUND

The exploding amount of data utilizes more and more storage space. However, data typically contains redundant information, which makes storing the data directly a waste of storage space and transmission bandwidth. Data compression exploits redundancy in a data packet or frame to provide a compressed packet, thereby reducing a number of bits needed to represent data. Thus, data compression improves data storage management by saving data storage capacity, speeding up file transfers and decreasing costs for storage hardware and network bandwidth.

Current data compression techniques may be complex and time consuming, and therefore there remains a need for improvements in a manner in which data is compressed. It is to these and other improvements that the present embodiments are generally directed.

SUMMARY

In a first embodiment, a method that may be performed by a processor of a data storage device is disclosed. The method includes receiving a bit stream in a data storage device. The method also includes performing a first level of compression on the received bit stream to obtain a symbol frame that includes a plurality of symbols. Less than all of the plurality of symbols is stored in a buffer memory having a pre-defined size. Statistics are then obtained for the symbols stored in the buffer memory. At least one data compression algorithm is selected based on the obtained statistics. A second level of compression is performed on all of the plurality of symbols with the selected at least one data compression algorithm.

In a second embodiment, another method that may be performed by a processor of a data storage device is disclosed. The method includes providing a data frame having a predetermined size. The data frame comprises original data bits received in the data storage device or symbols produced by performing a first level of compression on the original data bits. The method also includes encoding an initial portion of the original data bits or the symbols contained in the data frame by a fixed encoding scheme. During the encoding by the fixed encoding scheme, statistics for the initial portion of the original data bits or the symbols are collected. At least one data compression algorithm is selected based on the collected statistics. Compression encoding is performed on a remaining portion of the original data bits or the symbols with the selected at least one data compression algorithm.

In a third embodiment, a data storage device is provided. The data storage device includes at least one data storage medium and a controller that is operably coupled to the at least one data storage medium. The controller receives a bit stream in the data storage device and performs a first level of compression on the received bit stream to obtain a symbol frame including a plurality of symbols. The controller encodes an initial portion of the plurality of symbols contained in the symbol frame by a fixed encoding scheme. The controller also collects statistics for the initial portion of the symbol frame. The controller then selects at least one data compression algorithm based on the collected statistics. The controller then performs compression encoding on a remaining portion of the symbol frame with the selected at least one data compression algorithm.

This summary is not intended to describe each disclosed embodiment or every implementation of the data compression system and method. Many other novel advantages, features, and relationships will become apparent as this description proceeds. The figures and the description that follow more particularly exemplify illustrative embodiments.

DETAILED DESCRIPTION OF ILLUSTRATIVE EMBODIMENTS

The disclosure is related to data compression for data storage management in data storage or memory devices. In some embodiments, data compression for data storage management is carried out using partial statistics, which are described further below.

Figure 1:
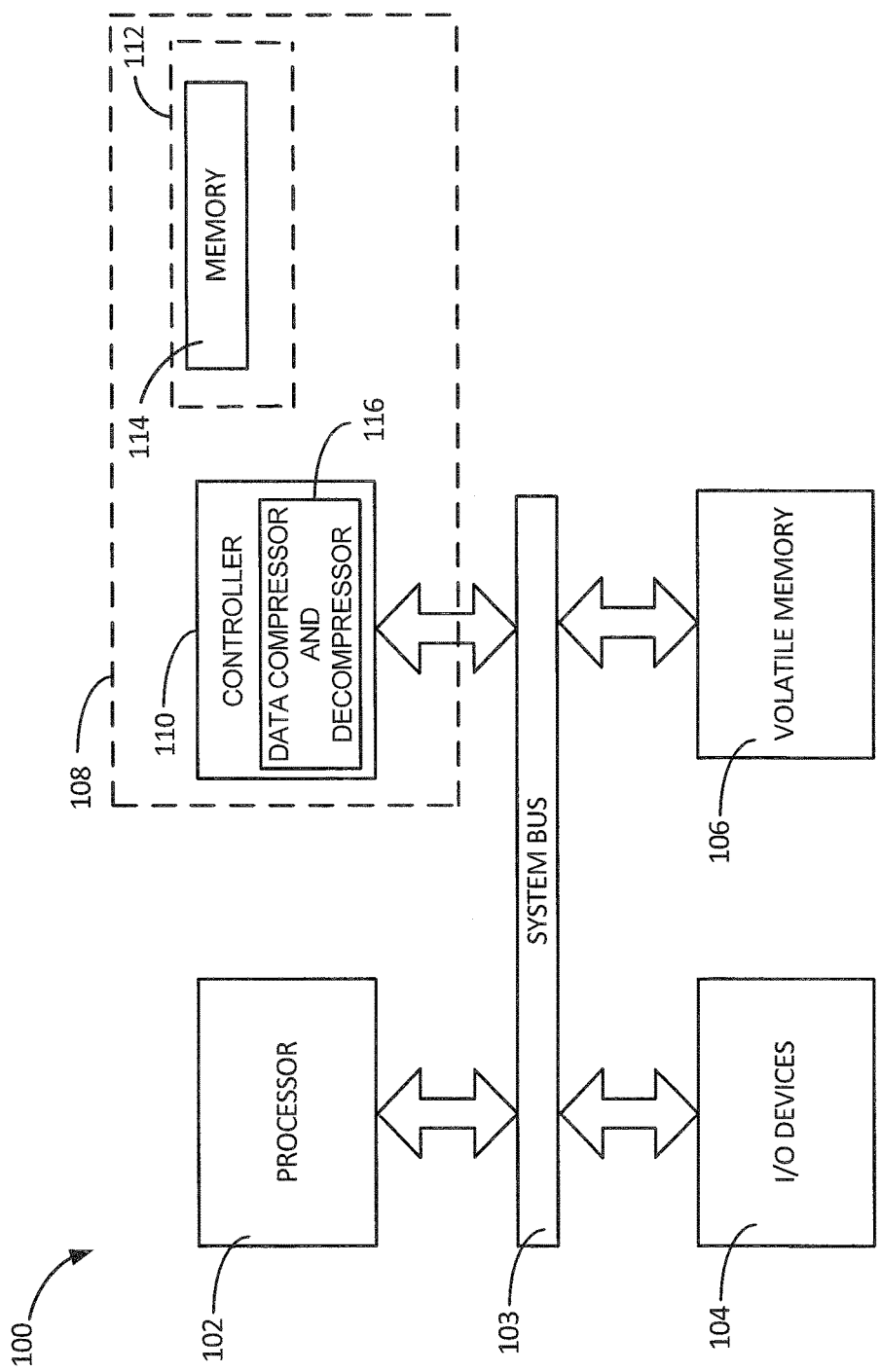
FIG. 1 is a simplified block diagram of an illustrative embodiment of a system of data storage management.

Referring to FIG. 1, a particular embodiment of a system of data storage management is shown and generally designated 100. The system of data storage management 100 may include a processor 102 connected to a system bus 103 which also can be connected to input/output (I/O) devices 104, such as a keyboard, monitor, modem, storage device, or pointing device. The system bus 103 may also be coupled to a memory 106, which may be a random access volatile memory. The system bus may additionally be coupled to a memory device 108.

The memory device 108 may include a controller 110, which may be coupled to the processor 102 via a connection through the system bus 103. In one embodiment, the memory device 108 comprises at least one storage entity 112. Storage entity 112 may include one or more memories 114. In some embodiments, storage entity 112 may comprise a plurality of memories of various sizes and types.

During operation, the processor 102 may send commands and data to the memory device 108 to retrieve or store data. The controller 110 can receive the commands and data from the processor 102 and then manage the execution of the commands to store or retrieve data from storage entity 112. It should be noted that controller 110 may include one or more integrated circuits (ICs).

In some embodiments, write commands received in memory device 108 from processor 102 or any other suitable sending interface include data packets or frames, which may be addressed by logical block addresses (LBAs). Device 108 processes the received commands and ultimately stores the data accompanying the received commands into storage entity 112 in a compressed form.

Data compression utilizes statistical redundancy of a data frame, and outputs a compressed packet of a smaller size. The efficiency of compression may be measured by a compression ratio, which is defined as:

$$\text{Compression ratio} = 1 - \frac{\text{Size of output data frame}}{\text{Size of input data frame}} \quad \text{Equation 1}$$

From Equation 1, it can be seen that the higher the compression ratio, the more the saving in data storage space in memory device 108.

Data compression may be implemented as one or more programmed hardware units 116 in the controller 110. In some embodiments, controller 110 may be implemented as a system on a chip (SOC) (e.g., an IC that integrates all components of the controller 108, including the compressor and a decompressor (e.g., hardware units 116), into a single chip). Due to a nature of some data compression algorithms, the compressor is typically substantially larger than the decompressor. Employing a relatively large compressor in memory 108 increases IC area, cost and power consumption. One data compression algorithm that may utilize a relatively large compressor to implement is described below in connection with FIGS. 2A and 2B. Thereafter, embodiments of compression algorithms that help reduce a size of the compressor are described in connection with FIGS. 3A, 3B, 4A and 4B.

Some widely used lossless data compression algorithms are based on a Lempel-Ziv (LZ) data compression technique. The LZ compression technique involves compressing a series of data strings by converting the strings into dictionary offsets and string lengths. The dictionary offsets and string lengths are known as symbols. The dictionary is not an external dictionary that lists known symbol strings, but is a sliding window containing the last N symbols encoded/decoded. The larger N, the longer it takes to search the whole dictionary for a match. Due to the dictionary searches carried out for LZ compression, the LZ compression is referred to herein as LZ search.

Examples of LZ-based compression algorithms include LZ77, LZ78 and their variants such as Lempel-Ziv-Storer-Szymanski (LZSS), Lempel-Ziv-Welch (LZW) and so on. The LZSS algorithm, for example, encodes current content (e.g., a current string portion) into an index/reference that points to the same content appearing earlier in the context. As a result, the corresponding output contains literals (e.g., entries not present in the dictionary yet), match lengths and offsets (e.g., references used to find previous appearance of current content), and flags to distinguish between a literal and a match.

The output from the LZ search is a stream of symbols, which still contains redundancy in each symbol type such as the literal and match length. Hence, the LZ search output can be further compressed. Accordingly, the LZ search is typically followed by a second-stage binary encoding algorithm in order to achieve a better compassion ratio. Since this second-stage encoding will produce the ultimate encoded binary stream, it is referred to as a bit-stream encoder (BSE).

There are many different bit stream encoding schemes. The simplest ones are fixed encoding, where a fixed scheme is applied to all data frames being compressed. This approach incurs minimum cost in hardware but usually has a low compression ratio.

Dynamic encoding schemes usually achieve better compression ratios. For example, the BSE can apply a dynamic prefix code such as a Huffman code to literals to provide another layer of compression. A basic principle for designing a good prefix code is to assign shorter codes for more frequent symbols, and longer codes for less frequent symbols. Hence, probabilities of each possible symbol should be available to obtain an optimal prefix code. Since specific distributions vary from data frame to data frame, statistics should be collected dynamically for every single compression unit, e.g., a 4 KB data frame. Dynamic encoding schemes employ collection of statistics to determine which encoding method or code table to use. Aside from the specific distribution, there are other statistics to be collected before the final encoding at the BSE stage. If there are multiple coding algorithms for one symbol type, encoded streams from each method should be obtained first, compared with each other, and an optimal coding algorithm selected and finally utilized in the BSE stage. This is referred to as a store-and-forward approach, as results of each available choice must be stored first and then evaluated to make the final coding decision.

Figure 2A:
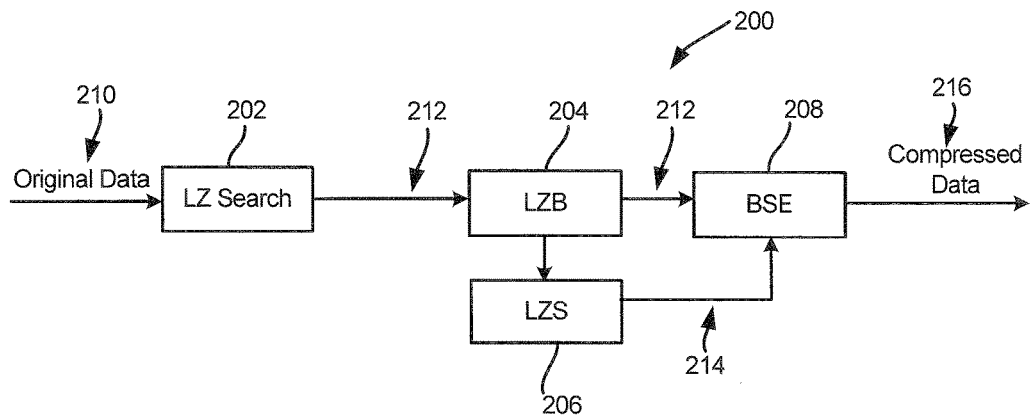
FIG. 2A is a diagrammatic illustration of a data compressor that carries out data compression by using full statistics.

FIG. 2A is a diagrammatic illustration of a compressor 200 that employs a store-and-forward approach for data compression. As can be seen in FIG. 2A, compressor 200 includes an LZ search unit 202, an LZ buffer (LZB) 204, an LZ statistics (LZS) unit 206 and a BSE 208. An original data stream 210 is input into LZ search unit 202, which applies an LZ-based compression algorithm to the original data stream 210 and outputs first compressed data 212. The entire first compressed data 212 is stored in LZB 204. LZS unit 206 obtains statics 214 for the entire first compressed data 212. The entire first compressed data 212 and the corresponding statistics 214 are then provided to BSE 208, which applies, for example, a Huffman encoding algorithm on the first compressed data 212 and outputs second or final compressed data 216.

Figure 2B:
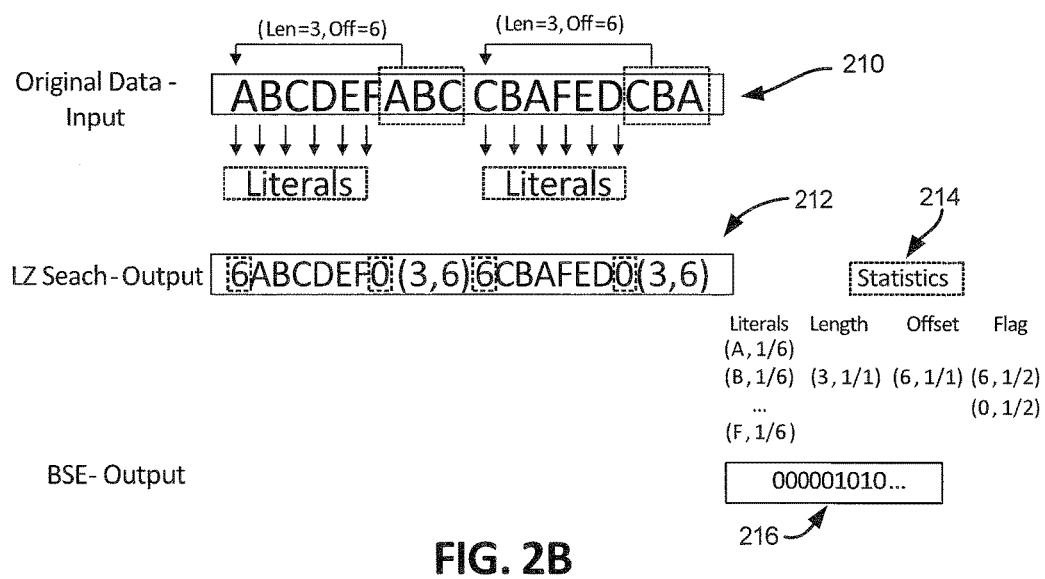
FIG. 2B is an example of data inputs and outputs at various stages of data compression by the data compressor of FIG. 2A.

FIG. 2B is an example showing input data and output data at various processing stages in compressor 200 of FIG. 2A. In the example shown in FIG. 2B, original data stream 210 includes redundant data portions. When the LZ search algorithm is applied original data stream, the algorithm outputs multiple symbol types, such as literals, lengths (len), and offsets (off). In the example of FIG. 2B, A, B, C, D, E and F are literals, 3 within parenthesis is a length, and 6 within parenthesis is an offset. Those symbols are a part of first compressed data 212. It should be noted that additional/other types of symbols may be included in first compressed data 212 obtained from LZ search unit 202 or other type of unit that carries out a first level of compression on an original data frame such as 210. An example of another type of symbol is a flag, which may be used to distinguish between a literal and a (length, offset) pair. In the example of FIG. 2B, flags such as 6 and 0, which may optionally be included in first compressed data 212, are shown within dashed boxes in data 212.

Statistics 214 are collected by going through the first compressed data 212 and counting the frequency of each symbol for all the respective symbol types. In the example of FIG. 2B, each of the 6 symbols of type literal appears twice in a total of 12, so each has a frequency of 1/6. For the length type, only a symbol "3" appears twice in a total of two length symbols, and thus its frequency is 1/1. Similarly, for the offset type, symbol "6" appears twice in a total of two offset symbols, and therefore its frequency is 1/1. Each optional flag 6, 0 appears twice out of a total of four flag symbols and therefore each flag 6, 0 has a frequency of 1/2.

As indicated above, in BSE stage 208, encoding algorithms are chosen for each symbol type based on statistics 214. After application of the respective algorithms, the second or final compressed data 216 is obtained as a binary string with 0s and 1s.

In the example shown in FIG. 2B, statistics 214 and final compressed data 216 are placed on the right side of the figure to show that the statistics 214 and the final compressed data 216 are not available until after all of first compressed data 212 is observed in LZB 204 (of FIG. 2A).

Drawbacks of the store-and-forward approach described above in connection with FIGS. 2A and 2B are multi-fold. For example, if the original data stream 210 input into LZ search unit 202 is a 4 KB data frame, in order to capture full statistics, LZS unit 206 must wait until the entire 4 KB data is processed and then start the evaluation of different coding schemes. As a result, BSE 208 will not start immediately after the first compressed data is available, causing a delay in the compression process. Further, collection of the full statistics 214 and the evaluation of the full statistics 214 may be time consuming. When the collection and evaluation of the full statistics 214 is substantially complicated, the LZS unit 206 may become the critical path. This results in limited maximum throughput for the compressor 200.

Additionally, a sufficiently large LZB 206 is needed to hold the entire first compressed data 212. Along with the storage space for the entire first compressed data 212, memory registers are needed to store the full statistics 214 and the logic units (e.g., logic gates) to process the full statistics 214. As a result, IC chip area and power consumption are increased relative to IC chip area and power consumption for fixed encoding scheme firmware, for example, which does not need LZB or LZS components.

To address the above-described problems with throughput, IC chip size, and power consumption associated with a compressor such as 200, one embodiment utilizes less than all of the first compressed data 212 to obtain partial statistics for use in evaluating coding schemes for further compression of the first compressed data 212. The use of partial statics allows for a reduction in size of the LZB relative to an LZB employed for obtaining full statistics. Based on an analysis of one implementation of a compressor, it was found that an overall area of a data compressor can be reduced by 20% by cutting the size of its LZB in half. An embodiment that employs partial statics and utilizes a reduced-size buffer is described below in connection with FIG. 3A.

The partial statistics approach is based on an assumption that statistics from a portion of a data frame will be the same as or similar to statistics from the entire data frame. This assumption applies, for example, when distributions of symbols do not change dramatically between a beginning of the data frame and a remaining portion of the data frame. For example, it is expected that frequencies of the 26 letters from the English alphabet are steady in an article. A negligible loss in compression ratios for symbols with consistent or stable distributions, such as literals and match length, is expected.

Figure 3A:
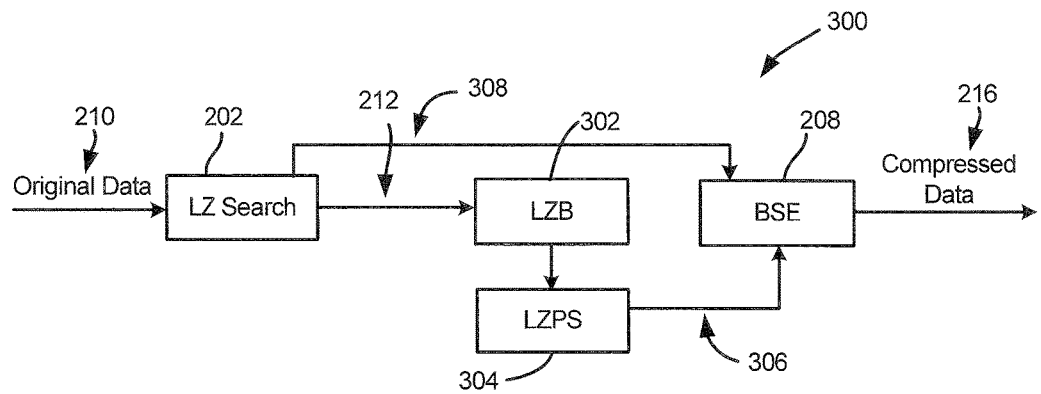
FIG. 3A is a diagrammatic illustration of a data compressor that carries out data compression by using partial statistics in accordance with one embodiment.

FIG. 3A is a diagrammatic illustration of a compressor 300 that employs a partial-statistics approach for data compression in accordance with one embodiment. Some components of compressor 300 are substantially similar to the components of compressor 200 (of FIG. 2A). The same reference numerals are used for the substantially similar components and a description of those components is not repeated.

In the embodiment shown in FIG. 3A, a portion (e.g., less than all) of the first compressed data 212 is utilized for obtaining statistics in compressor 300. For example, if the first compressed data 212 has a size of about 4K, compressor 300 may obtain statistics for only about half of the first compressed data 212 (e.g., about 2K). Accordingly, in this example, an LZB 302 having a size of about 2 KB may be employed. In other examples, statistics may be collected from 1K, 0.5K, or even smaller portions of the approximately 4 KB of first compressed data 212 to decide the ultimate encoding algorithms to be used in BSE 208. In general, LZB 302 may be substantially smaller than LZB 204 (of FIG. 2A) for a same size of first compressed data 212.

Since only a part of the first compressed data 212 is stored in LZB 302 and utilized to obtain statistics, the LZ statistics unit in the embodiment of FIG. 3A is referred to as an LZ partial statistics (LZPS) unit 304. In compressor 300, LZPS unit 304 provides partial statistics 306 obtained for the data stored in LZB 302 to BSE 208. Also, the entire first compressed data 212 is provided to BSE 208 via path 308 that bypasses LZB 302. BSE 208 carries out a second level of compression on the entire first compressed data 212 using an encoding algorithm selected based on the partial statistics 306. BSE 208 then outputs second or final compressed data 216. It should be noted that, in some embodiments, different encoding algorithms are selected for different symbol types.

Figure 3B:
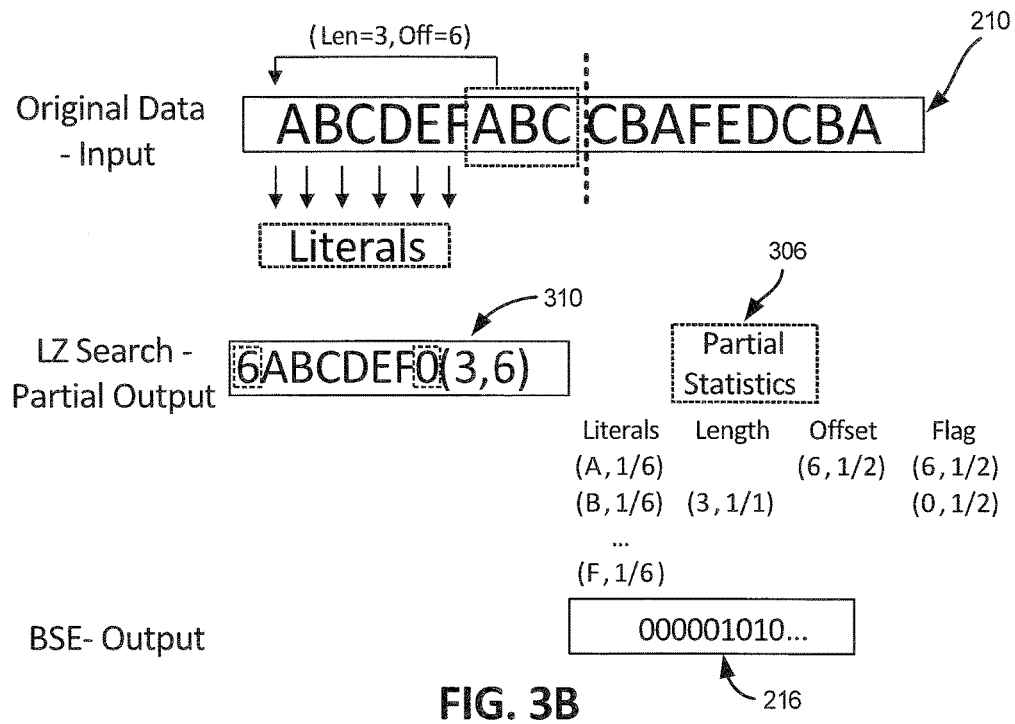
FIG. 3B is an example of data inputs and outputs at various stages of data compression by the data compressor of FIG. 3A.

FIG. 3B is an example showing input data and output data at various processing stages in compressor 300 of FIG. 3A. In the example of FIG. 3B, only a portion (e.g., portion 310) of the first compressed data 212 (shown in FIG. 2B) is utilized to obtain partial statistics 306.

Partial statistics 306 are collected by going through the first compressed data portion 310 and counting the frequency of each symbol in that portion. In data portion 310, A, B, C, D, E and F are literals, 3 is a length and 6 is an offset. Each of the 6 literals appears once in data portion 310 and therefore each literal has a frequency of 1/6. Additionally, in data portion 310, length 3 appears once, and also offset 6 appears once. Thus, length 3 and offset 6 have a same frequency of 1/1. Each optional flag 6, 0 appears once out of a total of two flag symbols and therefore each flag 6, 0 has a frequency of 1/2.

In BSE stage 208, encoding algorithms are chosen for each symbol type based on partial statistics 306. In the example shown in FIG. 3B, partial statistics 306 are the same as the full statistics 214 obtained in the example of FIG. 2B. Since the choice of encoding algorithms in BSE stage 208 depends on statistics 306, the encoding algorithms chosen in BSE stage 208 of compressor 300 are the same as the encoding algorithms chosen in compressor 200 (of FIG. 2A), which uses the full statistics approach.

In the simple example provided in FIGS. 2B and 3B, partial statistics 306 and full statics 214 are identical. However, there are typically small differences between full and partial statistics. When such small differences exit, there is no substantial drop in compression results for the partial statistics approach relative to the full statistics approach.

In compressor 300, the partial statistics 306 are available after the initial portion (for example, the first half) of the first compressed data 212 is available. This reduces a delay in obtaining final compressed data 216 from the BSE stage 208, and also reduces IC chip area and power consumption due to LZB 302 being substantially smaller than LZB 204 (of FIG. 2A).

Figure 4A:
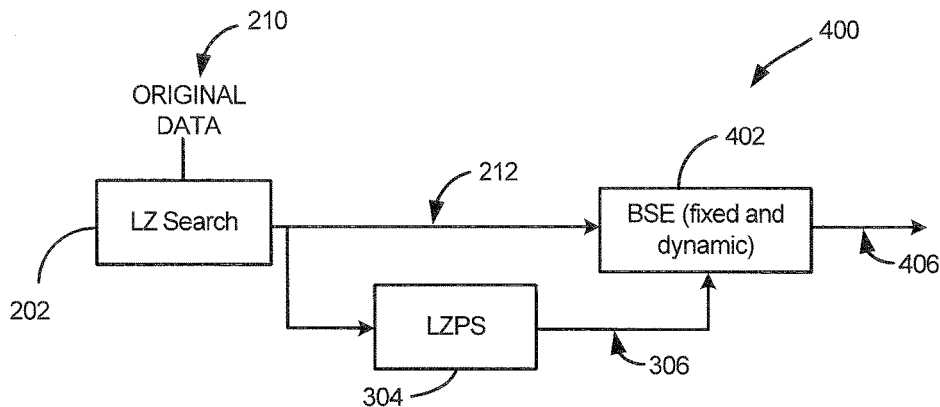
FIG. 4A is a diagrammatic illustration of a data compressor that carries out data compression by using partial statistics in accordance with another embodiment.
Figure 4B:
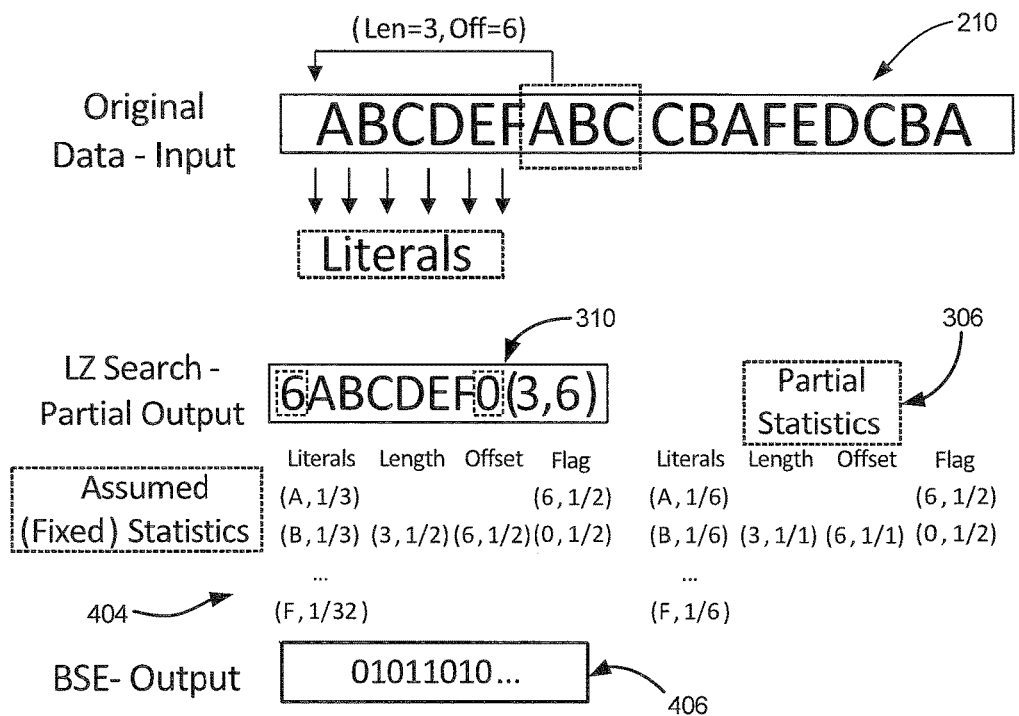
FIG. 4B is an example of data inputs and outputs at various stages of data compression by the data compressor of FIG. 4A.

FIG. 4A is a diagrammatic illustration of a compressor 400 that employs fixed statistics and dynamic partial statistics to compress data in accordance with one embodiment. In compressor 400, LZ search unit 202 and LZPS unit 304 are substantially similar to the corresponding units employed in compressor 300 (of FIG. 3A). However, no LZB such as 302 (of FIG. 3A) is employed in compressor 400. Further, compressor 400 includes a BSE stage 402 that employs a combination of assumed fixed statistics 404 and partial statistics 306 obtained from a portion of first compression data 212 to select encoding algorithms to carry out final compression of the first compressed data 212.

In compressor 400, a partial size (for example, 2K) of a frame (for example, a 4 KB frame) of first compressed data 212 is encoded using a fixed encoding scheme. During the encoding of the 2 KB data frame portion by the fixed encoding scheme, statistics are simultaneously collected for the 2 KB data frame portion. The simultaneous collection of statistics is carried out by LZPS 304. When the 2 KB data frame portion is encoded in BSE 402, BSE 402 selects an algorithm to encode the remaining 2 KB of the 4 KB frame of first compressed data 212 based on the simultaneously collected partial statistics 306, which it receives from LZPS unit 304. The remaining 2 KB of the 4 KB frame of first compressed data 212 is then encoded dynamically in BSE 402 using the selected algorithm.

The above-described data compression process carried out by compressor 400 involves substantially no wait period to observe the first compression data 212 before the second level of encoding by BSE 402 begins. This is because BSE 402 starts the encoding process using the fixed encoding scheme as soon as a first symbol of first compression data 212 is output by LZ search unit 202. As noted above, as the encoding of the first frame portion (for example, first 2K) of first compressed data 212 is taking place, statistics 306 are simultaneously collected for the first frame portion. The collected partial statistics 306 are used for selection of an algorithm that begins encoding the remaining portion (for example, the remaining 2K) of the first compressed data 212 as soon as the encoding of the first frame portion is complete. Thus, the BSE stage 402 of compressor 400 exhibits no delay resulting from collection of statistics. Also, as can be seen from FIG. 4B, which is an example showing input data and output data at various processing stages in compressor 400 of FIG. 4A, assumed fixed statistics 404 are different from the collected partial statistics 306. Due to use different assumed fixed statistics 404 and partial statistics 306 by BSE stage 402, final compressed data 406 differs from final compressed data 216 (of FIGS. 2B and 3B).

It should be noted that the compressor embodiments of FIGS. 3A and 4A may also be altered to enable collection of partial statics from a portion (e.g., less than all) of the original data stream 210. Thus, partial statistics may be collected for data streams 210 and/or 212 in different embodiments. As noted above, encoding by BSE 208, 402 is carried out by algorithms selected based on the collected partial statistics.

It should also be noted that, if the analysis of data for collection of statistics is relatively slow in the embodiment of FIG. 4A (e.g., LZPS 306 cannot catch up with the LZ search process carried out by LZ search unit 206), a small first-in, first-out (FIFO) memory (not shown) may be needed to store data from LZ search unit 206 until LZPS 306 completes the collection of statistics and the collected statistics are ready to be fed into BSE 402.

Experiments were carried out to obtain final compressed data using statistics collected from 0.5 KB, 0.25 KB, and 0.125 KB of a 4 KB frame of first compressed data. Compression ratios computed for the respective 0.5 KB, 0.25 KB, and 0.125 KB experiments were compared to a compression ratio obtained for an experiment using statistics collected from the entire 4 KB frame of first compressed data. On average, the compression ratio dropped by 0.04%, 0.09%, and 0.12%, for 0.5K, 0.25K, and 0.125 KB partial statistics, respectively. This demonstrates the effectiveness of the partial statistics embodiments in reducing compressor area/power with negligible losses in compression ratios.

Figure 5:
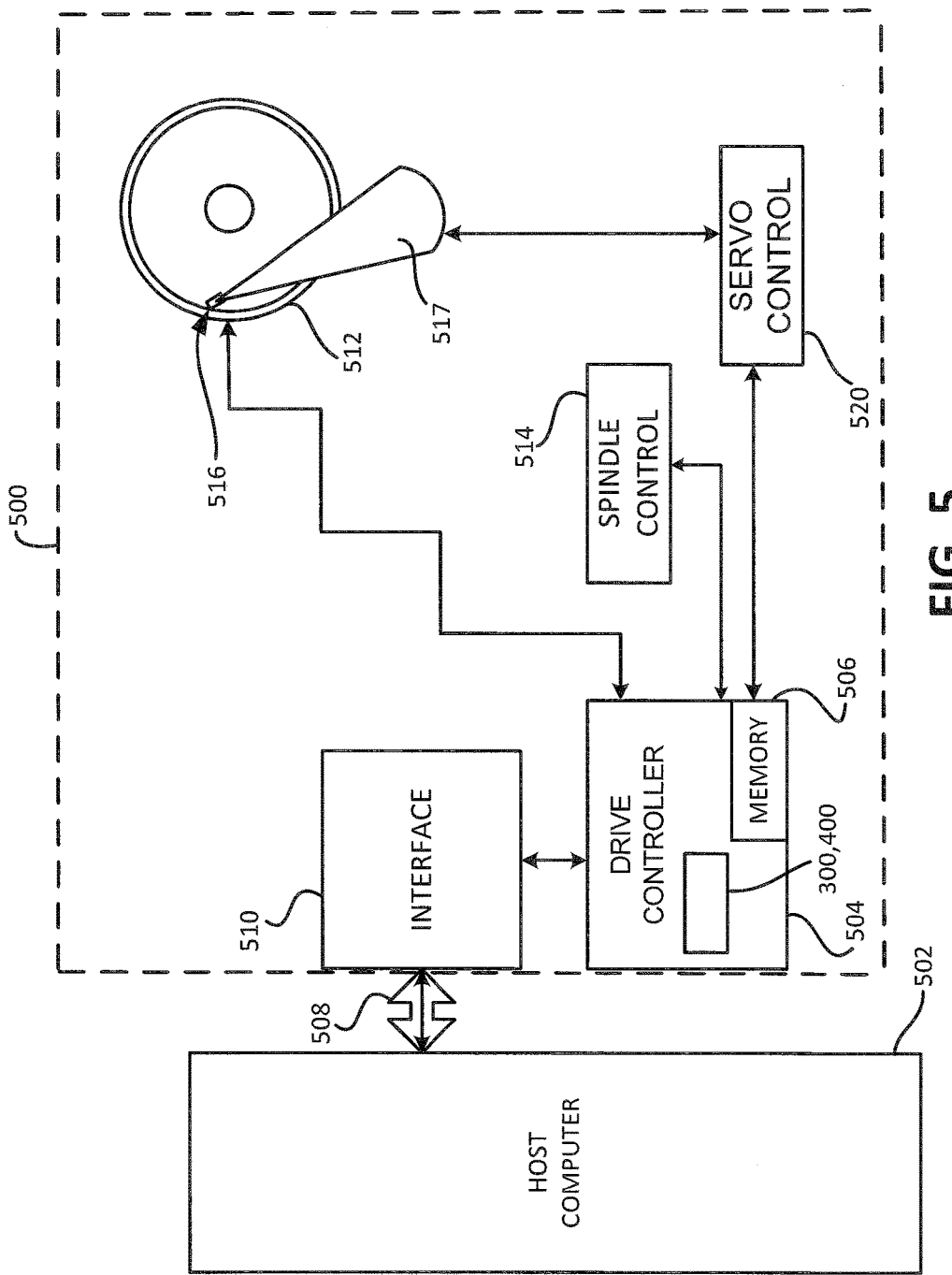
FIG. 5 is a block diagram of a disc drive that employs data compression in accordance with one embodiment.

FIG. 5 shows a block diagram of the disc drive 500 in accordance with one embodiment. Disc drive 500 is a particular example of a data storage or memory device 108 (of FIG. 1). Disc drive 500 is shown in FIG. 5 to be operably connected to a host computer 502 in which disc drive 500 may be mounted. Disc drive 500 includes a drive controller 504 that generally provides top level communication and control for disc drive 500 in conjunction with programming for drive controller 504 stored in controller memory 506. Disc drive 500 may communicate with host computer 502 using a bus 508.

Memory 506 can include random access memory (RAM), read only memory (ROM), and other sources of resident memory for drive controller 504. Disc drive 500 includes one or more data storage discs 512. Discs 512 are rotated at a substantially constant high speed by a spindle control circuit 514. One or more heads 516 communicate with the surface(s) of discs 512 to carry out data read/write operations. The radial position of heads 516 is controlled through the application of current to a coil in an actuator assembly 517. A servo control system 520 provides such control.

In disc drive 500, drive controller 504 may include a data compressor 300, 400 described above. In such an embodiment, drive controller 504, controller memory 506 and compressor 300, 400 may be a single IC (e.g., a SOC). A data decompressor (not shown) may also be a part of the single IC. In some embodiments, data compressor 300, 400 and the decompressor may comprise one or more ICs that are separate from an IC that comprises the disc controller 504. In some embodiments, compressor 300, 400 may comprise program code that may be stored in memory 506. The program code may be executed by a microprocessor within drive controller 504.

Data received form host computer 502 is received in drive 500 via bus 508. That received data is provided to drive controller 504 via interface 510. At least some of the received data is compressed by compressor 300, 400 prior to storage on disc(s) 512. In response to a request by host 502 for data stored in drive 500, any compressed data read by head 516 to satisfy the request is decompressed by the decompressor before it is sent from drive 500 to host 502.

Figure 6:
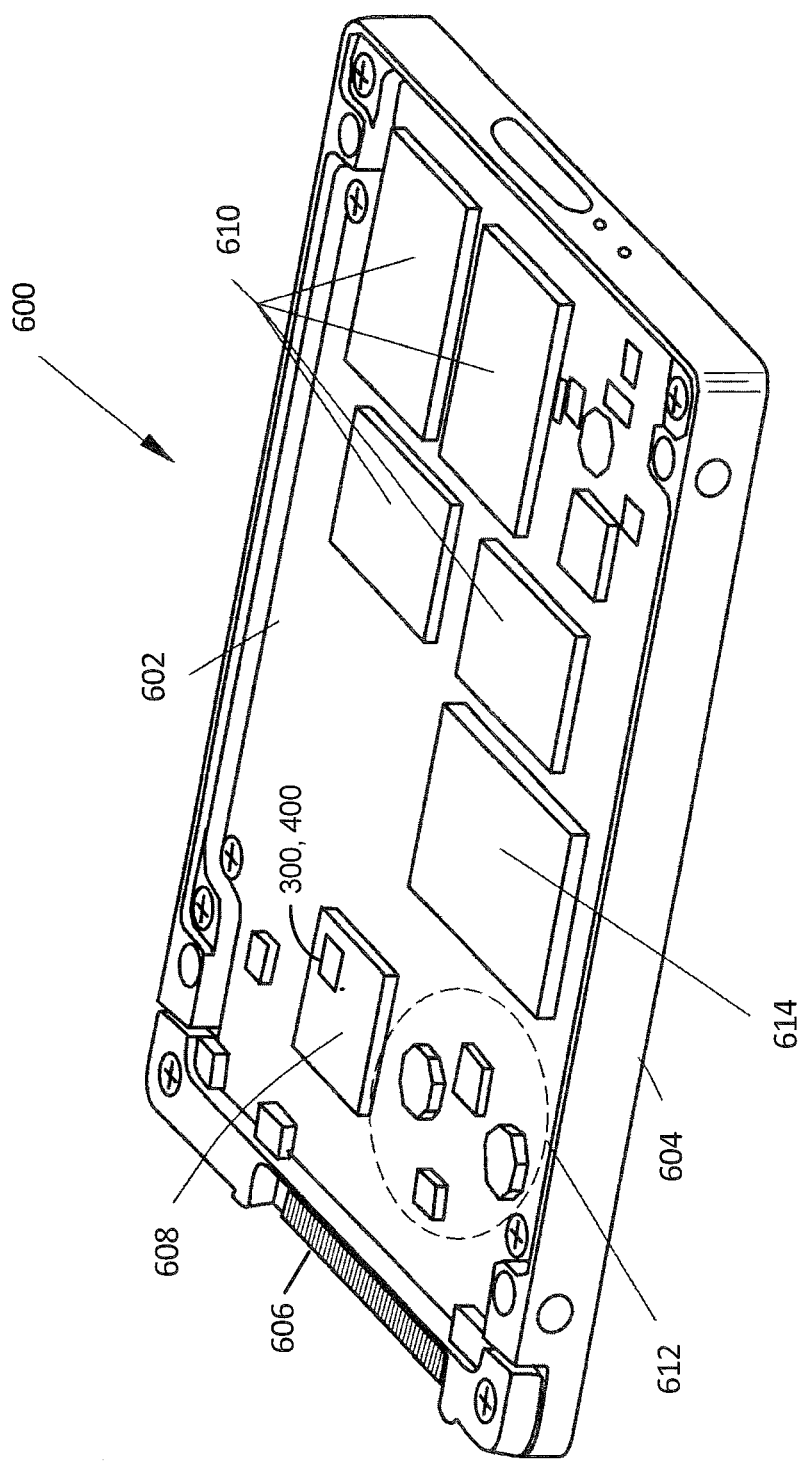
FIG. 6 is an isometric view of a solid-state drive that employs data compression in accordance with one embodiment.

FIG. 6 illustrates an oblique view of a solid state drive (SSD) 600 in accordance with one embodiment. SSD 600 is a particular example of a data storage or memory device 108 (of FIG. 1). SSD 600 includes one or more circuit card assemblies 602 and typically includes a protective, supportive housing 604, a top cover (not shown), and one or more interface connectors 606. SSD 600 further includes a controller ASIC 608, one or more non-volatile memory devices 610, and power regulation circuitry 612. The memory devices 610 are essentially the SSD's data storage media. SSD 600 may include erasure blocks as the physical storage locations within memory device 610, which may include Flash memory devices, for example. In some applications, SSD 600 further includes a power-backup energy storage device, such as a super-capacitor 614.

In accordance with certain aspects, the SSD 600 includes a circuit card assembly 602 that includes a connector 606 for connection to a host computer (not shown in FIG. 6). In accordance with certain aspects, the connector 606 includes a NVMe, SAS, FC-AL, SCSI, PCI-E, IDE, AT, ATA, SATA, IEEE-1394, USB or other interface connector adapted for connection to a host computer.

In SSD 600, ASIC controller 608 may include a data compressor 300, 400 described above. In such an embodiment, ASIC controller 608 and compressor 300, 400 may be a single ASIC (e.g., a SOC). A data decompressor (not shown) may also be a part of the single ASIC. In some embodiments, data compressor 300, 400 and the decompressor may comprise one or more ICs that are separate from ASIC controller 608. In some embodiments, compressor 300, 400 may comprise program code that is stored in a memory within controller ASIC 608. The program code may be executed by a microprocessor within controller ASIC 608.

Data form a host computer (not shown in FIG. 6) is received in SSD 600 via connector 606. That received data is provided to drive controller ASIC 608. At least some of the received data is compressed by compressor 300, 400 prior to storage in one or more memory devices 610. In response to a request by a host computer for data stored in SSD 600, any compressed data read from memory device(s) 610 to satisfy the request is decompressed by the decompressor before it is sent from SSD 600 to the host computer.

In addition to savings in storage space and transmission bandwidth, data compression brings other benefits when it comes to Flash memory devices such as 610 that may be included in SSDs such as 600. SSDs suffer from write amplification (WA) due to asymmetric writes, erase granularities, and garbage collection. In SSDs, WA is an undesirable phenomenon where the actual amount of physical information written is a multiple (greater than 1) of the logical amount intended to be written. SSDs have over-provisioning (OP), which is additional raw Flash memory space (in addition to the space allocated for user data). The higher the OP, the lower the WA. Since data compression reduces the actual amount of Flash memory space used to store user data, it increases the effective OP, which, in turn, improves WA and extends the life of the SSD. Data compression also boosts the SSD's read/write performance because a smaller amount of data will be read/written from/to the Flash memory device(s).

In accordance with various embodiments, the methods described herein may be implemented as one or more software programs running on one or more computer processors or controllers, such as those included in devices 108, 500 and 600. Dedicated hardware implementations including, but not limited to, application specific ICs, programmable logic arrays and other hardware devices can likewise be constructed to implement the methods described herein. It should be noted that the above-described data compression algorithms, which utilize partial statistics, may also be employed in data compressors that do not use LZ-based compression, but instead employ other suitable data compression techniques.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be reduced. Accordingly, the disclosure and the figures are to be regarded as illustrative rather than restrictive.

One or more embodiments of the disclosure may be referred to herein, individually and/or collectively, by the term "invention" merely for convenience and without intending to limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments employ more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method comprising:
    receiving a bit stream in a data storage device;
    performing, by a processor of the data storage device, a first level of compression on the received bit stream to obtain a symbol frame comprising a plurality of symbols;
    storing less than all of the plurality of symbols in a buffer memory having a pre-defined size to provide a subset of the plurality of symbols of the symbol frame, the subset of the plurality of symbols are for utilization in obtaining partial statistics;
    obtaining, by the processor, the partial statistics based on the subset of the plurality of symbols;
    selecting, by the processor, at least one data compression algorithm based on the obtained partial statistics, the at least one compression algorithm being applicable to different symbols of the plurality of symbols of the symbol frame that are not a part of the subset of the plurality of symbols; and performing, by the processor, a second level of compression on all of the plurality of symbols of the symbol frame with the selected at least one data compression algorithm.

2. The method of claim 1 and wherein the plurality of symbols comprises different types of symbols.

3. The method of claim 2 and wherein obtaining the statistics for the symbols stored in the buffer memory comprises obtaining frequencies of symbols for each of the different types of symbols.

4. The method of claim 3 and wherein the different types of symbols comprise literals, lengths and offsets.

5. The method of claim 3 and wherein selecting the at least one data compression algorithm based on the obtained statistics comprises selecting the at least one data compression algorithm based on the obtained frequencies of the symbols for each of the different types of symbols.

6. The method of claim 5 and wherein performing the second level of compression on all of the plurality of symbols with the selected at least one data compression algorithm comprises performing the second level of data compression on the different types of symbols with corresponding different types of data compression algorithms.

7. The method of claim 1 and further comprising encoding at least some of the plurality of symbols by a fixed encoding scheme based on assumed statistics that are different from the statistics for the symbols stored in the buffer memory.

8. The method of claim 1 and wherein the pre-defined size of the buffer memory is less than a size of the symbol frame.

9. A method comprising:
providing, in a data storage device, a data frame having a predetermined size, wherein the data frame comprises original data bits received in the data storage device or symbols produced by performing, by a processor of the data storage device, a first level of compression on the original data bits;
encoding, by the processor of the data storage device, an initial portion of the original data bits or the symbols contained in the data frame by a fixed encoding scheme employing assumed fixed statistics;
during the encoding by the fixed encoding scheme, collecting, by the processor, statistics for the initial portion of the original data bits or the symbols;
selecting, by the processor, at least one data compression algorithm based on the collected statistics; and
performing, by the processor, compression encoding on a remaining portion of the original data bits or the symbols with the selected at least one data compression algorithm.

10. The method of claim 9 and wherein performing the compression encoding on the remaining portion of the original data bits or the symbols comprises dynamically encoding the remaining portion of the original data bits or the symbols without a wait period between completion of the encoding of the initial portion of the data bits or the symbols and commencement of the compression encoding on the remaining portion of the original data bits or the symbols.

11. The method of claim 9 and wherein the data frame comprises different types of symbols.

12. The method of claim 11 and wherein the different types of symbols comprise literals, lengths, offsets and flags.

13. The method of claim 12 and wherein the at least one data compression algorithm comprises a first data compression algorithm for literals, a second data compression algorithm for lengths and a third data compression algorithm for offsets.

14. A data storage device comprising:
at least one data storage medium; and
a controller operably coupled to the at least one data storage medium, the controller configured to:
receive a bit stream in the data storage device;
perform a first level of compression on the received bit stream to obtain a symbol frame comprising a plurality of symbols;
encode an initial portion of the plurality of symbols contained in the symbol frame by a fixed encoding scheme employing assumed fixed statistics;
collect statistics for the initial portion of the symbol frame;
select at least one data compression algorithm based on the collected statistics; and
perform compression encoding on a remaining portion of the symbol frame with the selected at least one data compression algorithm.

15. The data storage device of claim 14 and wherein the controller is further configured to collect the statistics for the initial portion of the data stream during the encoding by the fixed encoding scheme.

16. The data storage device of claim 14 and wherein the at least one data storage medium comprises a solid state memory.

17. The data storage device of claim 14 and wherein the controller is configured to perform the compression encoding on the remaining portion of the symbol frame by dynamically encoding the remaining portion of the symbol frame without employing a wait period between completion of the encoding of the initial portion of the symbol frame and commencement of the compression encoding on the remaining portion of the original data bits or the symbols.

18. The data storage device of claim 17 and wherein the symbol frame comprises different types of symbols.

19. The data storage device of claim 18 and wherein the different types of symbols comprise literals, lengths and offsets.

20. The data storage device of claim 19 and wherein the at least one data compression algorithm comprises a first data compression algorithm for literals, a second data compression algorithm for lengths and a third data compression algorithm for offsets.

* * * * *